United States Patent
Lupescu et al.

(10) Patent No.: US 10,523,222 B1
(45) Date of Patent: *Dec. 31, 2019

(54) SYSTEMS AND METHODS FOR USING A PHASE LOCKED LOOP (PLL) TO PROVIDE MULTIPLE OUTPUT SIGNALS

(71) Applicant: Corning Optical Communications LLC, Hickory, NC (US)

(72) Inventors: Guy Lupescu, Tel Aviv (IL); Pavel Rozenbaum, Or Yehuda (IL)

(73) Assignee: Corning Optical Communications LLC, Hickory, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/450,542

(22) Filed: Jun. 24, 2019

Related U.S. Application Data (63) Continuation of application No. 16/139,748, filed on Sep. 24, 2018, now Pat. No. 10,389,372.

(51) Int. Cl.
| | | |
|---|---|---|
| H04B 10/00 | (2013.01) | |
| H03L 7/099 | (2006.01) | |
| H04B 10/2575 | (2013.01) | |
| H03L 7/089 | (2006.01) | |
| H04B 10/40 | (2013.01) | |
| H04J 14/00 | (2006.01) | |

(52) U.S. Cl.
CPC ............ *H03L 7/0992* (2013.01); *H03L 7/089* (2013.01); *H04B 10/25753* (2013.01); *H04B 10/40* (2013.01)

(58) Field of Classification Search
CPC ................ H03L 7/06; H03L 7/07; H03L 7/08
See application file for complete search history.

(56) References Cited

U.S. PATENT DOCUMENTS

| | | | | |
|---|---|---|---|---|
| 6,327,463 B1 * | 12/2001 | Welland | ................. | H03B 21/02 331/360 |
| 2003/0071691 A1 * | 4/2003 | Boerstler | ............. | H03K 3/0315 331/57 |
| 2003/0142838 A1 * | 7/2003 | Brennan | ............... | H03L 7/1974 381/98 |

* cited by examiner

*Primary Examiner* — Daniel G Dobson
(74) *Attorney, Agent, or Firm* — C. Keith Montgomery (57) ABSTRACT

A phase locked loop (PLL) provides output signals at multiple frequencies. In particular, the PLL includes a phase detector and two voltage controlled oscillators (VCOs). One of the VCOs is selectively enabled depending on a desired output signal. The phase detector receives a reference signal and a feedback signal from the enabled one of the two VCOs. The phase detector outputs a control signal that controls the VCO that provided the feedback signal.

18 Claims, 6 Drawing Sheets

SYSTEMS AND METHODS FOR USING A PHASE LOCKED LOOP (PLL) TO PROVIDE MULTIPLE OUTPUT SIGNALS

RELATED APPLICATIONS

This application is a continuation of U.S. application Ser. No. 16/139,748, filed Sep. 24, 2018, the entire contents of which are hereby incorporated by reference.

BACKGROUND

The disclosure relates generally to communications systems and, more particularly, to multiple frequency capable phase locked loops (PLLs) which may be used in communications systems, including wireless communications systems (WCSs), such as wireless distribution systems (WDSs), distributed antenna systems (DASs), remote radio head (RRH) systems, and small radio cell systems.

Communications circuits have evolved from cumbersome wire-based systems that could only transmit simple codes to sophisticated wireless systems that support high-bandwidth multimedia communication. Early systems relied on a super-heterodyne receiver. Such super-heterodyne receivers included several tuned circuits, which increased the complexity of the device. As early as 1932, British researchers looking for an alternative to the structure of the super-heterodyne receiver created a direct-conversion or homodyne receiver. The homodyne receiver used a local oscillator to tune to a desired input frequency and provide an output which was multiplied with the input signal to provide the original modulation information. It was rapidly discovered that the local oscillator would drift in frequency, and thus, an automatic correction signal was applied to the oscillator, maintaining it in the same phase and frequency of the desired signal. This automatic correction signal was generated by a circuit known as a PLL. Applications for PLLs have proliferated and can be found in communications circuits for a variety of functions such as frequency mixing, modulation, demodulation, synchronization, frequency synthesis, signal recovery, and the like.

The simplest PLL circuits are a phase comparator, a loop filter, and a voltage controlled oscillator (VCO) that provides a feedback signal to the phase comparator. The phase comparator compares the feedback signal to the input signal and generates a control signal for the VCO. As with many feedback systems, it takes time for the control signal to adjust the VCO to the point where the output of the VCO is in phase with the input signal. This time may sometimes be referred to as the time required to settle and lock.

While there are many communications systems in which a PLL may be used, the demand for wireless communications systems that include such PLLs is increasing. That is, wireless customers are increasingly demanding digital data services, such as streaming video signals. At the same time, some wireless customers use their wireless communications devices in areas that are poorly serviced by conventional cellular networks, such as inside certain buildings or areas where there is little cellular coverage. One response to the intersection of these two concerns has been the use of a WDS or a DAS. WDSs include remote units configured to receive and transmit communications signals to client devices within the antenna range of the remote units. WDSs can be particularly useful when deployed inside buildings or other indoor environments where the wireless communications devices may not otherwise be able to effectively receive radio frequency (RF) signals from a source.

Figure 1:
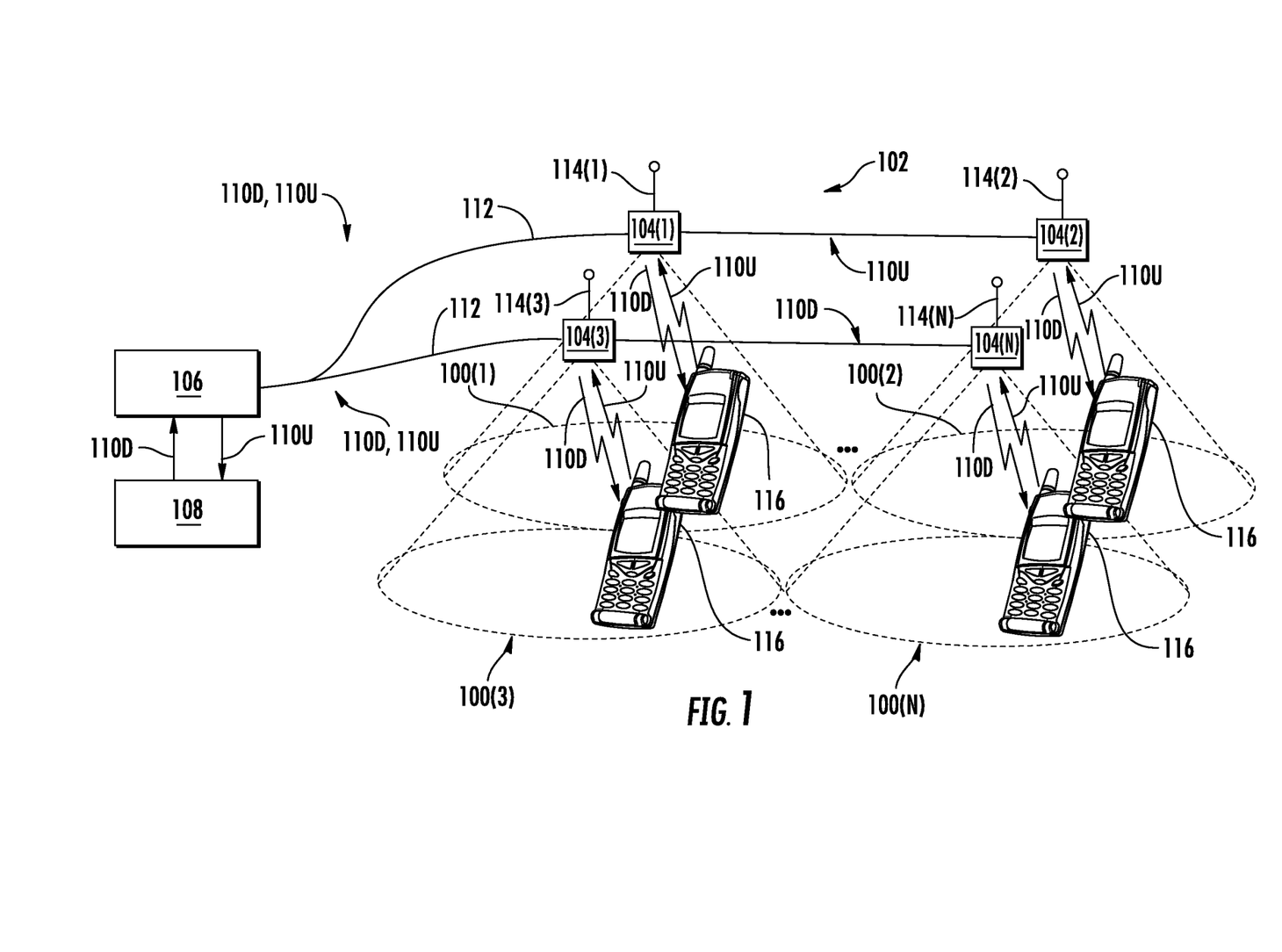
FIG. 1 illustrates distribution of communications services to remote coverage areas of a wireless distribution system (WDS)

In this regard, FIG. 1 illustrates distribution of communications services to remote coverage areas 100(1)-100(N) of a WDS 102, wherein 'N' is the number of remote coverage areas. These communications services can include cellular services, wireless services, such as Common Public Radio Interface (CPRI), RF identification (RFID) tracking, Wireless Fidelity (Wi-Fi), local area network (LAN), and wireless LAN (WLAN), wireless solutions (Bluetooth, Wi-Fi Global Positioning System (GPS) signal-based, and others) for location-based services, and combinations thereof, as examples. The variety of services may dictate that each service have its own transceiver with accompanying PLL. The remote coverage areas 100(1)-100(N) may be remotely located. In this regard, the remote coverage areas 100(1)-100(N) are created by and centered on remote units 104(1)-104(N) connected to a head-end equipment (HEE) 106 (e.g., a head-end controller, a head-end unit (HEU), or a central unit). Each such remote unit 104(1)-104(N) may include one or more PLLs. The HEE 106 may be communicatively coupled to a signal source 108, for example, a base transceiver station (BTS) or a baseband unit (BBU). In this regard, the HEE 106 receives downlink communications signals 110D from the signal source 108 to be distributed to the remote units 104(1)-104(N). The remote units 104(1)-104(N) are configured to receive the downlink communications signals 110D from the HEE 106 over a communications medium 112 to be distributed to the respective remote coverage areas 100(1)-100(N) of the remote units 104(1)-104(N). In a non-limiting example, the communications medium 112 may be a wired communications medium, a wireless communications medium, or an optical fiber-based communications medium. Each of the remote units 104(1)-104(N) may include an RF transmitter/receiver (not shown) and a respective antenna 114(1)-114(N) operably connected to the RF transmitter/receiver to wirelessly distribute the communications services to client devices 116 within the respective remote coverage areas 100(1)-100(N). The remote units 104(1)-104(N) are also configured to receive uplink communications signals 110U from the client devices 116 in the respective remote coverage areas 100(1)-100(N) to be distributed to the signal source 108. The size of each of the remote coverage areas 100(1)-100(N) is determined by an amount of RF power transmitted by the respective remote units 104(1)-104(N), receiver sensitivity, antenna gain, and RF environment, as well as by RF transmitter/receiver sensitivity of the client devices 116. The client devices 116 usually have a fixed maximum RF receiver sensitivity, so that the above-mentioned properties of the remote units 104(1)-104(N) mainly determine the size of the respective remote coverage areas 100(1)-100(N).

With reference to FIG. 1, the HEE 106 includes electronic processing devices, for example a field-programmable gate array (FPGA), a digital signal processor (DSP), and/or a central processing unit (CPU), for processing the downlink communications signals 110D and the uplink communications signals 110U. Likewise, each of the remote units 104(1)-104(N) also employs electronic processing devices for processing the downlink communications signals 110D and the uplink communications signals 110U. Further, the communications medium 112 is only able to carry the downlink communications signals 110D and the uplink communications signals 110U up to a maximum bandwidth. Collectively, the processing capabilities of the electronic processing devices in the HEE 106, the processing capabilities of the electronic processing devices in the remote units 104(1)-104(N), and the maximum bandwidth of the communications medium 112 provide the system resources available in the WDS 102. It may be desirable to utilize the system resources in the WDS 102 to improve overall performance of the WDS 102.

Within a WDS such as the WDS 102, PLLs may be used to reconstruct a clock signal at the remote units 104(1)-104(N). In some such systems, the same clock reconstruction circuit may support two different clock frequencies for two different applications (e.g., a 122.88 megahertz (MHz) clock for CPRI applications and a 156.25 MHz clock for Ethernet applications). Since the VCOs used for these applications are typically narrowband, a single VCO cannot be used to support both frequencies. Conventional solutions use two PLLs, one for each clock frequency. While conventional solutions are adequate for situations where the remote unit is powered and/or there is ample space, there may be instances where power savings or space constraints make such duplicative solution a burden.

No admission is made that any reference cited herein constitutes prior art. Applicant expressly reserves the right to challenge the accuracy and pertinency of any cited documents.

SUMMARY

In one exemplary aspect, a PLL is provided. The PLL includes a phase detector. The phase detector is configured to receive a reference input signal and one of two feedback signals. The phase detector is also configured to output a control signal. The PLL also includes a first VCO. The first VCO is configured to receive the control signal and output a first one of the two feedback signals. The first VCO is also configured to receive a first enable signal that activates the first VCO. The PLL also includes a second VCO. The second VCO is configured to receive the control signal and output a second one of the two feedback signals. The second VCO is also configured to receive a second enable signal that activates the second VCO such that only one of the first VCO and the second VCO are active at a time.

An additional embodiment of the disclosure relates to a method of operating a PLL. The method includes, while providing a first reference signal to a phase detector, enabling a first VCO and providing a first control signal from the phase detector to the first VCO to generate a first feedback signal to the phase detector. The method also includes, while providing a second reference signal to the phase detector, enabling a second VCO and providing a second control signal from the phase detector to the second VCO to generate a second feedback signal to the phase detector.

An additional embodiment of the disclosure relates to a wireless distribution system (WDS). The WDS includes a plurality of remote units including a transceiver including a PLL. The PLL includes a phase detector. The phase detector is configured to receive a reference input signal and one of two feedback signals. The phase detector is also configured to output a control signal. The PLL also includes a first VCO. The first VCO is configured to receive the control signal and output a first one of the two feedback signals. The first VCO is also configured to receive a first enable signal that activates the first VCO. The PLL also includes a second VCO. The second VCO is configured to receive the control signal and output a second one of the two feedback signals. The second VCO is also configured to receive a second enable signal that activates the second VCO such that only one of the first VCO and the second VCO are active at a time. The WDS also includes a head-end unit (HEU). The HEU is coupled to the plurality of remote units via a plurality of communications media, respectively. The HEU is configured to distribute a plurality of downlink communications signals to the plurality of remote units via the plurality of communications media, respectively. The HEU is also configured to receive a plurality of uplink communications signals from the plurality of remote units via the plurality of communications media, respectively. The HEU is also configured to generate a plurality of communications signals based on the plurality of uplink communications signals. Each of the plurality of communications signals corresponds to a signal channel and a remote unit among the plurality of remote units communicating on the signal channel. The WDS also includes a signal processing circuit including a signal input communicatively coupled to a plurality of signal sources, respectively.

Additional features and advantages will be set forth in the detailed description which follows, and in part will be readily apparent to those skilled in the art from the description or recognized by practicing the embodiments as described in the written description and claims hereof, as well as the appended drawings.

It is to be understood that both the foregoing general description and the following detailed description are merely exemplary, and are intended to provide an overview or framework to understand the nature and character of the claims.

The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

One embodiment of the disclosure relates to a phase locked loop (PLL) to provide output signals at multiple frequencies. In particular, the PLL includes a phase detector and two voltage controlled oscillators (VCOs). One of the VCOs is selectively enabled depending on a desired output signal. The phase detector receives a reference signal. The phase detector also receives a feedback signal from the enabled one of the two VCOs. The phase detector outputs a control signal that controls the VCO that provided the feedback signal. An additional embodiment of the disclosure relates to a method of operating a PLL that includes selectively enabling one of two VCOs to provide a feedback signal to a phase detector. By providing a PLL with a single phase detector and two VCOs, a multiple frequency PLL is provided. The consolidation of what historically has required multiple separate distinct PLLs reduces component counts and correspondingly reduces costs. Further, the overall area consumed by the PLL within the transceiver is reduced relative to plural separate, distinct PLLs.

Figure 2:
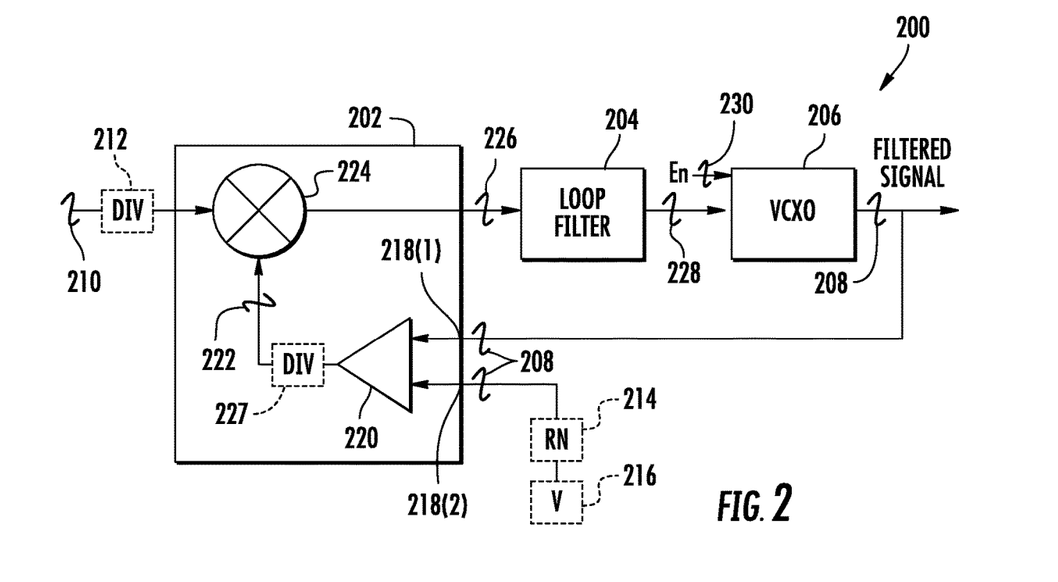
FIG. 2 is a simplified block diagram of a conventional phase locked loop (PLL) that may be used in a WDS such as the WDS of FIG. 1.

Before addressing exemplary aspects of the present disclosure, a brief overview of a conventional PLL is provided with reference to FIG. 2. The discussion of the present disclosure begins below with reference to FIG. 3. In this regard, FIG. 2 illustrates an exemplary conventional PLL 200. The PLL 200, at its core, includes a phase/frequency detector (PFD) 202 (sometimes referred to as a PLL integrated circuit (PLL IC) or PLL chip), a loop filter 204, and a voltage controlled oscillator (VCO) 206. The VCO 206 produces a "filtered signal" 208 which acts as a feedback signal to the PFD 202 and may also be used by other components as needed (e.g., clock reconstruction, frequency synthesis, etc.). In an exemplary aspect, the VCO 206 is a voltage controlled crystal oscillator and may be referred to as a VCXO. The PFD 202 receives a reference signal 210, which is typically a clock signal to be reconstructed or modified, and the filtered signal 208. In an exemplary aspect, the PLL 200 may include an optional pre-divider 212 that divides the reference signal 210 to a desired frequency. The PLL 200 may include an optional resistor network 214 (also labeled RN in FIG. 2) that couples a fixed voltage (V) 216 to the PFD 202. The fixed voltage 216 may be a ground or other static (direct current (DC)) voltage (Vss, Vdd, etc.). The filtered signal 208 is provided to an input 218(1), and the output of the resistor network 214 is provided to a second input 218(2). Alternatively, a balun (not illustrated) that turns the filtered signal 208 into a differential signal may be used to provide signals to the inputs 218(1) and 218(2).

With continued reference to FIG. 2, the PFD 202 may (if the two inputs 218(1)-218(2) are present) include a differential receiver 220 that provides a single signal 222 to a phase comparator 224. The PFD 202 may further include an optional divider 227 that changes the signal 222 to a desired frequency. The phase comparator 224 combines the signal 222 with the reference signal 210 to provide a control signal 226 to the loop filter 204. The loop filter 204 filters the control signal 226 to provide a filtered signal 228 to the VCO 206. The VCO 206 may be selectively enabled by an enable signal 230. The filtered signal 228 drives the VCO 206 to produce the filtered signal 208. In practice, combining the signal 222 with the reference signal 210 will cause the filtered signal 228 to drive the VCO 206 in such a manner that the filtered signal 208 is a clean match of the reference signal 210 (i.e., noise and jitter are removed).

As noted above, in many conventional WDSs, two or more PLLs may be used to provide two desired frequencies based on different services offered through the remote units. Thus, for example, a remote unit may provide Common Public Radio Interface (CPRI) and Ethernet services and need to provide corresponding frequencies of 122.88 megahertz (MHz) and 156.25 MHz, respectively to provide those services. While it is certainly possible to have multiple PLLs to provide the various frequencies, it should be appreciated that the duplication of PLLs increases costs and the size of the resulting device.

Figure 3:
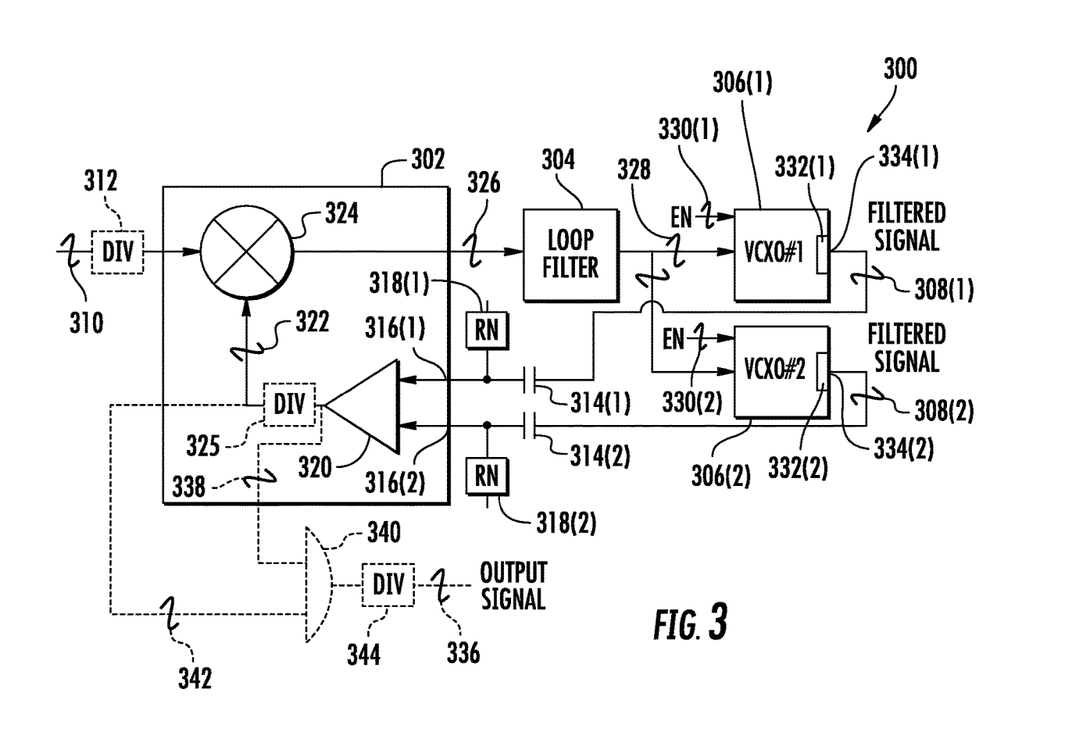
FIG. 3 is a simplified block diagram of a PLL having two oscillators driven by a single phase detector according to an exemplary aspect of the present disclosure.
Figure 4:
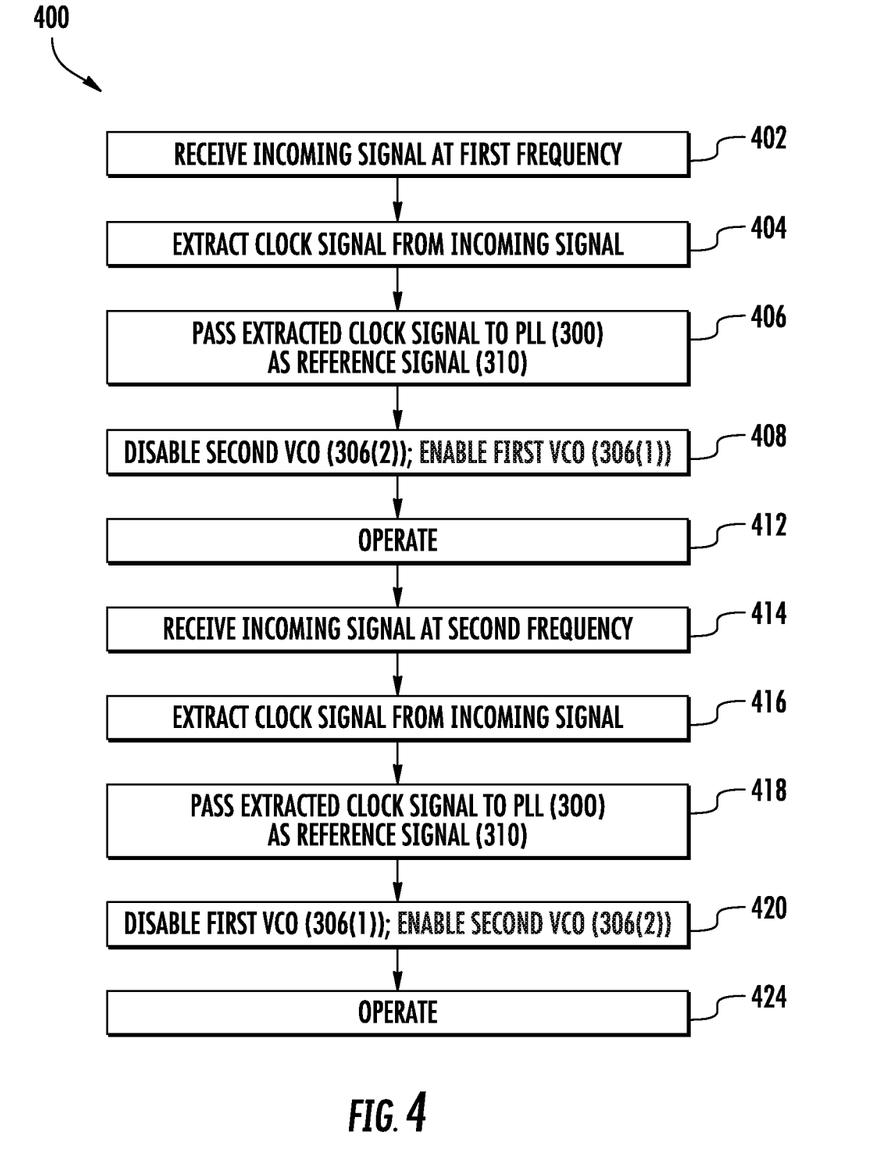
FIG. 4 illustrates a flowchart for the operation of the PLL of FIG. 3.

Exemplary aspects of the present disclosure allow the plural PLLs to be consolidated into a single PLL with plural VCOs that are selectively enabled based on a desired output frequency. By consolidating the PLLs, cost savings and space savings are effectuated. FIG. 3 provides an illustration of the structural differences between the conventional PLL 200 of FIG. 2 and a PLL according to an exemplary aspect of the present disclosure. FIG. 4 provides a more detailed explanation of the operation of the PLL according to an exemplary aspect of the present disclosure.

In this regard, FIG. 3 illustrates a PLL 300 according to an exemplary aspect. The PLL 300 includes a PFD 302, a loop filter 304, and a pair of VCOs 306(1)-306(2). The VCO 306(1) produces a signal 308(1) which may selectively act as a feedback signal to the PFD 302. The VCO 306(2) produces a signal 308(2) which may alternatively act as a feedback signal to the PFD 302. In an exemplary aspect, each of the VCOs 306(1)-306(2) is a voltage controlled crystal oscillator and may be referred to as a VCXO. The PFD 302 receives a reference signal 310, which is typically a clock signal to be reconstructed or modified. The reference signal 310 may pass through an optional divider 312. The divider 312 may be part of the PFD 302 or external (as illustrated). The signals 308(1) and 308(2) may pass through respective capacitors 314(1) and 314(2) before arriving at inputs 316(1) and 316(2) of the PFD 302.

With continued reference to FIG. 3 resistor networks 318(1) and 318(2) (also labeled RN in FIG. 3) are also coupled to the respective inputs 316(1) and 316(2) of the PFD 302. As with the resistor network 214 of FIG. 2, the resistor networks 318(1) and 318(2) may be coupled to fixed DC voltage levels (e.g., Vss, Vdd) to provide a fixed DC voltage level to the inputs 316(1) and 316(2) of the PFD 302. The capacitors 314(1) and 314(2) block the DC voltage levels from being passed to the VCOs 306(1)-306(2) while allowing the signals 308(1) and 308(2), which are alternating current (AC) signals, from the VCOs 306(1)-306(2) to reach the inputs 316(1) and 316(2). The resistor networks 318(1) and 318(2) provide correct DC common mode voltage for inputs of a differential receiver 320. The parameters of these resistor networks 318(1) and 318(2) are set so they do not significantly reduce the amplitudes of the signals 308(1) and 308(2). Thus the inputs 316(1) and 316(2) satisfy the technical requirements of the differential receiver 320.

With continued reference to FIG. 3, the PFD 302 may include a differential receiver 320 that provides a single signal 322 to a phase comparator 324. Before passing to the phase comparator 324, the signal 322 may pass through an optional divider 325 that divides the signal 322 to a desired frequency. The phase comparator 324 combines the signal 322 with the reference signal 310 to provide a control signal 326 to the loop filter 304. The loop filter 304 filters the control signal 326 to provide a filtered signal 328 to the VCOs 306(1)-306(2).

The VCOs 306(1)-306(2) may be selectively enabled by enable signals 330(1)-330(2). It should be appreciated that at any given time, only one of the VCOs 306(1)-306(2) is enabled. When a VCO is not enabled, it will exhibit a high output impedance. The filtered signal 328 drives the VCOs 306(1)-306(2) to produce the signals 308(1)-308(2). In practice, mixing the signal 322 with the reference signal 310 will cause the filtered signal 328 to drive the enabled one of the VCOs 306(1)-306(2) in such a manner that the signal 308(1)-308(2) is a clean match of the reference signal 310 (i.e., noise and jitter are removed).

In an exemplary aspect, the VCOs 306(1)-306(2) include respective internal switches 332(1) and 332(2) immediately before outputs 334(1) and 334(2). The internal switches 332(1) and 332(2) enable three-state outputs at the outputs 334(1) and 334(2). Using the VCO 306(1) as the example, but understanding that the VCO 306(2) operates in a similar fashion, in a first state, the VCO 306(1) provides the signal 308(1). In a second state, the VCO 306(1) provides a high impedance. In a third state, the output 334(1) floats. This third state is not likely to be used during operation.

An output signal 336 is generated by the PLL 300. In an exemplary aspect, a tap is provided between the differential receiver 320 and the divider 325 to pull signal 338 to an optional multiplexer 340. The multiplexer 340 may be present if a second tap is provided after the divider 325 to pull signal 342. When both signals 338 and 342 are present, the multiplexer 340 may select between and provide an output signal which may be the output signal 336 or may be divided by an optional divider 344 to generate the output signal 336. Note that if only one tap is present, the multiplexer 340 may be omitted. Likewise, if the tap is present after the divider 325, the divider 344 may be omitted. In other exemplary aspects, the divider 344 may merely be omitted.

As noted above, FIG. 4 provides a more detailed description of operation of the PLL 300 of FIG. 3 with reference to a process 400. It should be appreciated that when the PLL 300 initially starts, both the first VCO 306(1) and the second VCO 306(2) may be disabled. The process 400 begins by receiving an incoming signal at a first frequency (block 402). In an exemplary aspect, this incoming signal corresponds to a CPRI application and is at 122.88 MHz. A clock signal is extracted from the incoming signal (block 404). In an exemplary aspect, the clock signal is embedded in the incoming signal. The extracted clock signal is passed to the PLL 300 as the reference signal 310 (block 406). A control system (not shown) enables the first VCO 306(1) (block 408) using the appropriate enable signal. To the extent necessary, the second VCO 306(2) is disabled prior to enabling the first VCO 306(1). This enabling may cause the internal switches 332(1) and 332(2) to be adjusted to the appropriate ones of the three states. The PLL 300 then operates and generates a cleaned-up version of the reference signal 310 as the signal 308(1) (block 412).

With continued reference to FIG. 4, at some subsequent time, the device receives an incoming signal at a second frequency (block 414). In an exemplary aspect, this incoming signal corresponds to an Ethernet application and is at 156.25 MHz. A clock signal is extracted from the incoming signal (block 416). In an exemplary aspect, the clock signal is embedded in the incoming signal. The extracted clock signal is passed to the PLL 300 as the reference signal 310 (block 418). A control system (not shown) disables the first VCO 306(1) and enables the second VCO 306(2) (block 420) using the appropriate enable signals. In an exemplary aspect, the disabling and enabling may include a reset of any dividers and the VCOs 306(1)-306(2). Again, this enabling and disabling may involve adjusting the internal switches 332(1) and 332(2) as appropriate. The PLL 300 then operates and generates a cleaned-up version of the reference signal 310 as the signal 308(2) (block 424).

Figure 5:
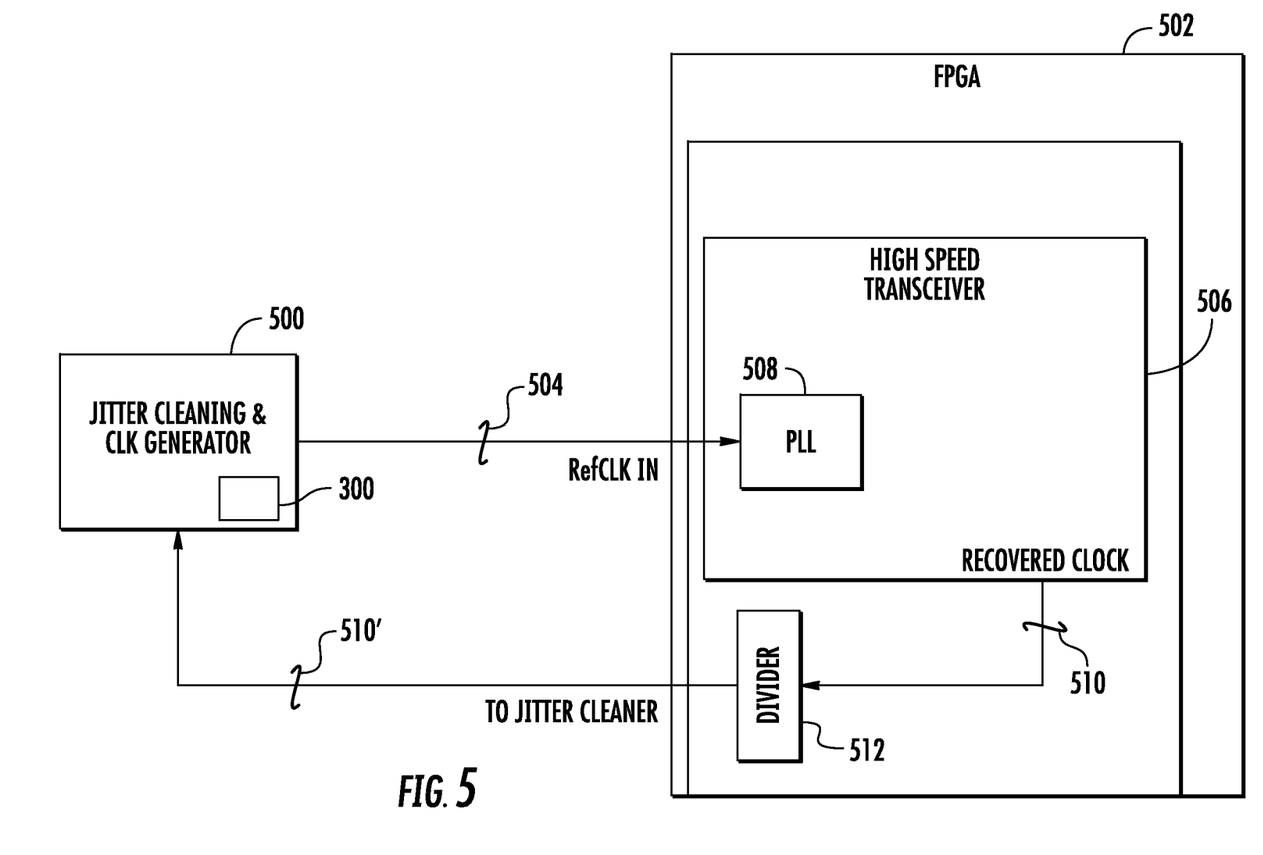
FIG. 5 is a simplified block diagram of a PLL according to exemplary aspects of the present disclosure used with a field programmable gate array (FPGA) in a two-frequency system.

FIG. 5 provides a simplified block diagram of the PLL 300 in a jitter cleaning and clock generator circuit 500 working to provide a field programmable gate array (FPGA) 502 a clean reference clock signal 504. The PLL 300 is configured to provide two recovered clock signals depending on the operating frequency of the FPGA 502. In particular, the FPGA 502 may include a high speed transceiver 506 that may include a PLL 508 that recovers and outputs a recovered clock signal 510 from incoming signals. The recovered clock signal 510 may be jittery. The recovered clock signal 510 may be divided by a divider 512. After division, or without division, some version 510' of the recovered clock signal is provided to the jitter cleaning and clock generator circuit 500, where the PLL 300 generates a clean clock signal using one of the VCOs 306(1)-306(2) (not illustrated in FIG. 5).

Figure 6:
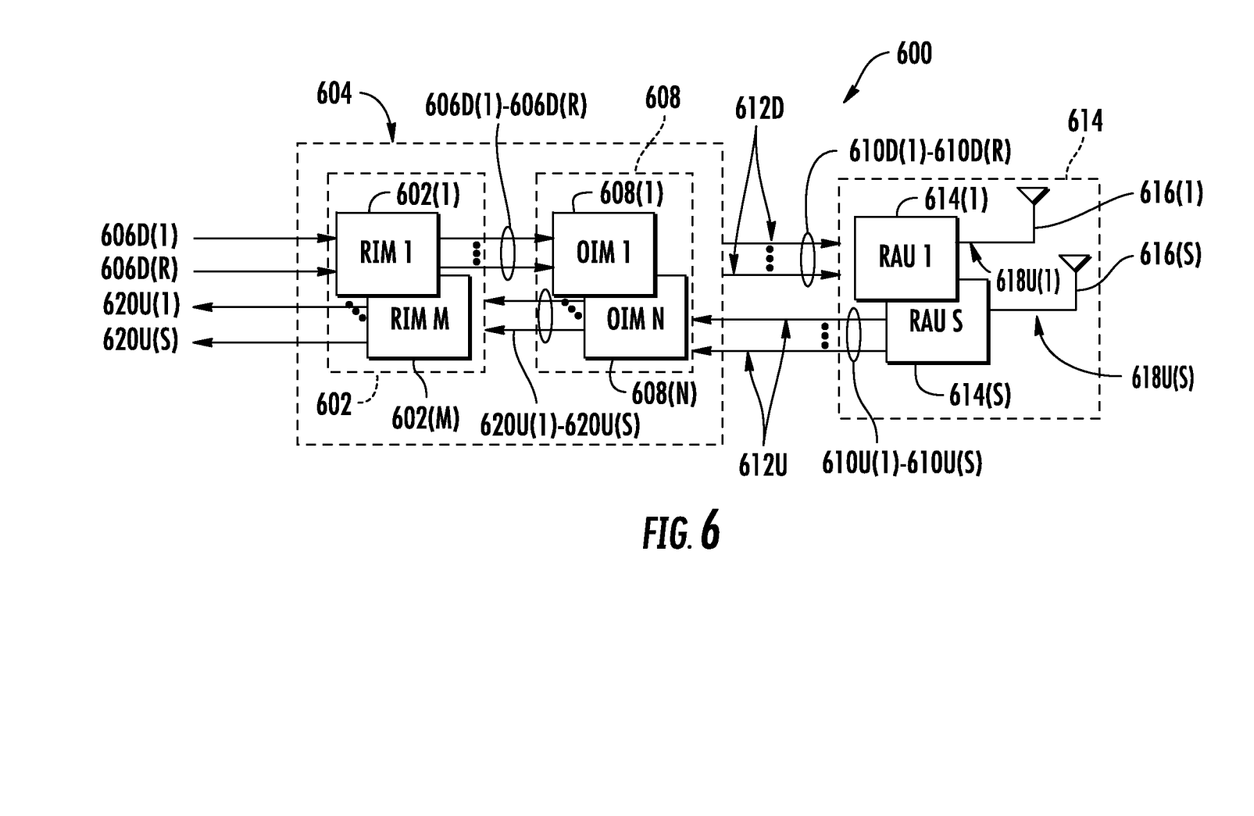
FIG. 6 is a schematic diagram of an exemplary optical fiber-based WDS that includes transceivers that may employ PLLs according to exemplary aspects of the present disclosure.

FIG. 6 is a schematic diagram of an exemplary optical fiber-based WDS 600 that may include one or more PLLs 300. The optical fiber-based WDS 600 includes an optical fiber for distributing communications services for multiple frequency bands. The optical fiber-based WDS 600 in this example is comprised of three (3) main components. One or more radio interfaces provided in the form of radio interface modules (RIMs) 602(1)-602(M) are provided in a central unit 604 to receive and process downlink electrical communications signals 606D(1)-606D(R) prior to optical conversion into downlink optical fiber-based communications signals. The downlink electrical communications signals 606D(1)-606D(R) may be received from a base station (not shown) as an example. The receiver that receives the downlink electrical communications signals 606D(1)-606D(R) may include one or more PLLs 300. The RIMs 602(1)-602(M) provide both downlink and uplink interfaces for signal processing. The notations "1-R" and "1-M" indicate that any number of the referenced component, 1-R and 1-M, respectively, may be provided. The central unit 604 is configured to accept the RIMs 602(1)-602(M) as modular components that can easily be installed and removed or replaced in the central unit 604. In one example, the central unit 604 is configured to support up to twelve (12) RIMs 602(1)-602(12). Each RIM 602(1)-602(M) can be designed to support a particular type of signal source or range of signal sources (i.e., frequencies) to provide flexibility in configuring the central unit 604 and the optical fiber-based WDS 600 to support the desired signal sources.

For example, one RIM 602 may be configured to support the Personal Communication Services (PCS) radio band. Another RIM 602 may be configured to support the 800 MHz radio band. In this example, by inclusion of these RIMs 602, the central unit 604 could be configured to support and distribute communications signals on both PCS and Long Term Evolution (LTE) 700 MHz radio bands, as an example. RIMs 602 may be provided in the central unit 604 that support any frequency bands desired, including, but not limited to, the US Cellular band, PCS band, Advanced Wireless Services (AWS) band, 700 MHz band, Global System for Mobile communications (GSM) 900, GSM 1800, and Universal Mobile Telecommunications System (UMTS). The RIMs 602(1)-602(M) may also be provided in the central unit 604 that support any wireless technologies desired, including, but not limited to, Code Division Multiple Access (CDMA), CDMA200, 1×RTT, Evolution-Data Only (EV-DO), UMTS, High-speed Packet Access (HSPA), GSM, General Packet Radio Services (GPRS), Enhanced Data GSM Environment (EDGE), Time Division Multiple Access (TDMA), LTE, iDEN, and Cellular Digital Packet Data (CDPD).

The RIMs 602(1)-602(M) may be provided in the central unit 604 that support any frequencies desired, including, but not limited to, US Federal Communications Commission (FCC) and Industry Canada frequencies (824-849 MHz on uplink and 869-894 MHz on downlink), US FCC and Industry Canada frequencies (1850-1915 MHz on uplink and 1930-1995 MHz on downlink), US FCC and Industry Canada frequencies (1710-1755 MHz on uplink and 260-2155 MHz on downlink), US FCC frequencies (698-716 MHz and 776-787 MHz on uplink and 728-746 MHz on downlink), European Union Radio and Telecommunication Terminal Equipment (EU R&TTE) frequencies (880-915 MHz on uplink and 925-960 MHz on downlink), EU R&TTE frequencies (1710-1785 MHz on uplink and 1805-1880 MHz on downlink), EU R&TTE frequencies (1920-1980 MHz on uplink and 260-2170 MHz on downlink), or any of the replacement frequencies set forth in the Radio Equipment Directive (RED) promulgated Jun. 13, 2017; US FCC frequencies (806-824 MHz on uplink and 851-869 MHz on downlink), US FCC frequencies (896-901 MHz on uplink and 929-941 MHz on downlink), US FCC frequencies (793-805 MHz on uplink and 763-775 MHz on downlink), and US FCC frequencies (2495-2690 MHz on uplink and downlink).

With continuing reference to FIG. 6, the downlink electrical communications signals 606D(1)-606D(R) are provided to a plurality of optical interfaces provided in the form of optical interface modules (OIMs) 608(1)-608(N) in this embodiment to convert the downlink electrical communications signals 606D(1)-606D(R) into downlink optical fiber-based communications signals 610D(1)-610D(R). The notation "1-N" indicates that any number of the referenced component 1-N may be provided. The OIMs 608(1)-608(N) may be configured to provide one or more optical interface components (OICs) that contain optical-to-electrical (O/E) and electrical-to-optical (E/O) converters (not shown), as will be described in more detail below. The OIMs 608(1)-608(N) support the radio bands that can be provided by the RIMs 602(1)-602(M), including the examples previously described above.

The OIMs 608(1)-608(N) each include E/O converters to convert the downlink electrical communications signals 606D(1)-606D(R) into the downlink optical fiber-based communications signals 610D(1)-610D(R). The downlink optical fiber-based communications signals 610D(1)-610D(R) are communicated over a downlink optical fiber-based communications medium 612D to a plurality of remote units 614(1)-614(S), which may be remote antenna units ("RAUs 614(1)-614(S)"). The notation "1-S" indicates that any number of the referenced component 1-S may be provided. O/E converters provided in the remote units 614(1)-614(S) convert the downlink optical fiber-based communications signals 610D(1)-610D(R) back into the downlink electrical communications signals 606D(1)-606D(R), which are provided to antennas 616(1)-616(S) in the remote units 614(1)-614(S) to distribute to client devices (not shown) in the reception range of the antennas 616(1)-616(S).

E/O converters are also provided in the remote units 614(1)-614(S) to convert uplink electrical communications signals 618U(1)-618U(S) received from client devices through the antennas 616(1)-616(S) into uplink optical fiber-based communications signals 610U(1)-610U(S). The remote units 614(1)-614(S) communicate the uplink optical fiber-based communications signals 610U(1)-610U(S) over an uplink optical fiber-based communications medium 612U to the OIMs 608(1)-608(N) in the central unit 604. The OIMs 608(1)-608(N) include O/E converters that convert the received uplink optical fiber-based communications signals 610U(1)-610U(S) into uplink electrical communications signals 620U(1)-620U(S), which are processed by the RIMs 602(1)-602(M) and provided as the uplink electrical communications signals 620U(1)-620U(S). The central unit 604 may provide the uplink electrical communications signals 620U(1)-620U(S) to a base station or other communications system.

Note that the downlink optical fiber-based communications medium 612D and the uplink optical fiber-based communications medium 612U connected to each remote unit 614(1)-614(S) may be a common optical fiber-based communications medium, wherein for example, wave division multiplexing (WDM) may be employed to provide the downlink optical fiber-based communications signals 610D(1)-610D(R) and the uplink optical fiber-based communications signals 610U(1)-610U(S) on the same optical fiber-based communications medium.

Figure 7:
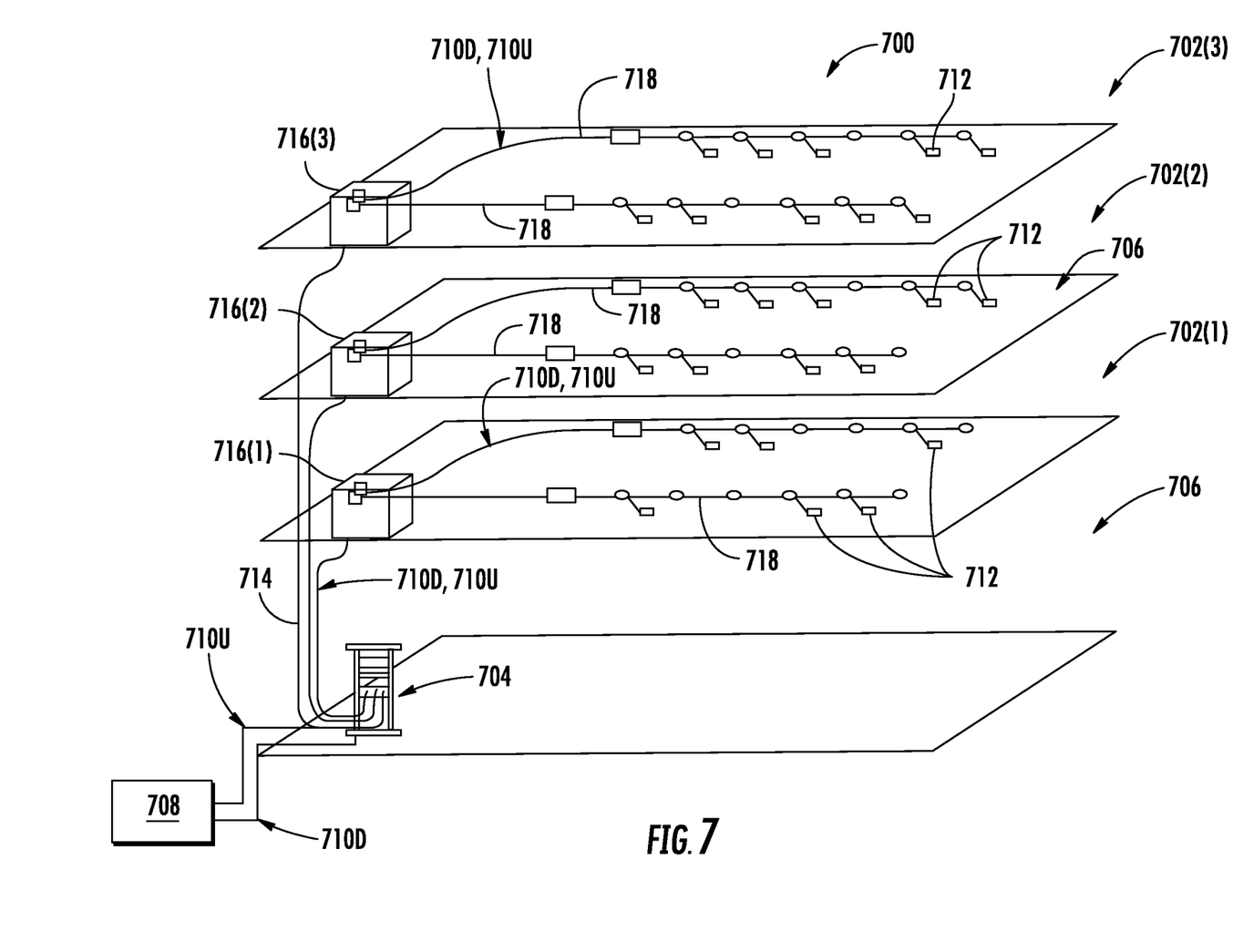
FIG. 7 is a partial schematic cut-away diagram of an exemplary building infrastructure in which a WDS(s), including the WDS of FIG. 6, is configured to allocate digital channels associated with communications signals into spectrum chunks.

The optical fiber-based WDS 600 of FIG. 6 can be provided in a WDS provided in an indoor environment, as illustrated in FIG. 7. FIG. 7 is a partial schematic cut-away diagram of an exemplary building infrastructure 700 in which a WDS(s), including the optical fiber-based WDS 600 of FIG. 6, is configured to allocate digital channels associated with communications signals into spectrum chunks. The building infrastructure 700 in this embodiment includes a first (ground) floor 702(1), a second floor 702(2), and a third floor 702(3). The floors 702(1)-702(3) are serviced by a central unit 704 to provide antenna coverage areas 706 in the building infrastructure 700. The central unit 704 is communicatively coupled to a base station 708 to receive downlink communications signals 710D from the base station 708. The central unit 704 is communicatively coupled to a plurality of remote units 712 to distribute the downlink communications signals 710D to the remote units 712 and to receive uplink communications signals 710U from the remote units 712, as previously discussed above. The downlink communications signals 710D and the uplink communications signals 710U communicated between the central unit 704 and the remote units 712 are carried over a riser cable 714. The riser cable 714 may be routed through interconnect units (ICUs) 716(1)-716(3) dedicated to each of the floors 702(1)-702(3) that route the downlink communications signals 710D and the uplink communications signals 710U to the remote units 712 and also provide power to the remote units 712 via array cables 718.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product, or software, that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes: a machine-readable storage medium (e.g., read only memory (ROM), random access memory (RAM), a magnetic disk storage medium, an optical storage medium, flash memory devices, etc.), and the like.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It will be apparent to those skilled in the art that various modifications and variations can be made without departing from the spirit or scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A wireless distribution system (WDS), comprising:
    a plurality of remote units comprising a transceiver comprising a phase locked loop (PLL) comprising:
        a phase detector configured to:
            receive a reference input signal and one of two feedback signals; and
            output a control signal;
        a first voltage controlled oscillator (VCO) configured to:
            receive the control signal and output a first one of the two feedback signals; and
            receive a first enable signal that activates the first VCO; and
        a second VCO configured to:
            receive the control signal and output a second one of the two feedback signals; and
            receive a second enable signal that activates the second VCO such that only one of the first VCO and the second VCO are active at a time; and
    a central unit coupled to the plurality of remote units via a plurality of optical fiber-based communications media, respectively, and configured to:
        distribute a plurality of downlink optical communications signals to the plurality of remote units via the plurality of optical fiber-based communications media, respectively;
        receive a plurality of uplink communications signals from the plurality of remote units via the plurality of optical fiber-based communications media, respectively; and
        generate a plurality of communications signals based on the plurality of uplink communications signals, wherein each of the plurality of communications signals corresponds to a signal channel and a remote unit among the plurality of remote units communicating on the signal channel.

2. The WDS of claim 1, wherein each remote unit comprises at least one electrical-to-optical converter.

3. The WDS of claim 2, wherein the PLL further comprises a loop filter.

4. The WDS of claim 2, wherein the first VCO comprises a voltage controlled crystal oscillator.

5. The WDS of claim 2, wherein the HEU is further configured to:
    receive a plurality of radio frequency (RF) downlink communications signals;
    convert the plurality of RF downlink communications signals into a plurality of optical downlink communications signals, respectively;
    distribute the plurality of optical downlink communications signals to the plurality of remote units via the plurality of optical fiber-based communications media, respectively;
    receive a plurality of optical uplink communications signals from the plurality of remote units via the plurality of optical fiber-based communications media, respectively; and
    convert the plurality of optical uplink communications signals into a plurality of RF uplink communications signals, respectively.

6. The WDS of claim 5, wherein the plurality of remote units is further configured to:
    receive the plurality of optical downlink communications signals via the plurality of optical fiber-based communications media, respectively;
    convert the plurality of optical downlink communications signals into the plurality of RF downlink communications signals, respectively;
    receive the plurality of RF uplink communications signals;
    convert the plurality of RF uplink communications signals into the plurality of optical uplink communications signals, respectively; and
    provide the plurality of optical uplink communications signals to the central unit via the plurality of optical fiber-based communications media, respectively.

7. A wireless distribution system (WDS), comprising:
    at least one remote unit comprising a transceiver comprising a phase locked loop (PLL) comprising:
        a phase detector configured to:
            receive a reference input signal and one of two feedback signals; and
            output a control signal;
        a first voltage controlled oscillator (VCO) configured to:
            receive the control signal and output a first one of the two feedback signals; and
            receive a first enable signal that activates the first VCO; and
        a second VCO configured to:
            receive the control signal and output a second one of the two feedback signals; and
            receive a second enable signal that activates the second VCO such that only one of the first VCO and the second VCO are active at a time;
    a central unit coupled to the at least one remote unit via a plurality of optical fiber-based communications media, respectively, and configured to:
        distribute a plurality of downlink communications signals to the plurality of remote units via the plurality of optical fiber-based communications media, respectively;
        receive a plurality of uplink communications signals from the at least one remote unit via the plurality of optical fiber-based communications media, respectively; and
        generate a plurality of communications signals; and
    a signal processing circuit comprising a signal input communicatively coupled to a plurality of signal sources, respectively.

8. The WDS of claim 7, wherein each remote unit comprises at least one electrical-to-optical converter.

9. The WDS of claim 8, wherein the PLL further comprises a loop filter.

10. The WDS of claim 8, wherein the first VCO comprises a voltage controlled crystal oscillator.

11. The WDS of claim 8, wherein the central unit is further configured to:
    receive a plurality of radio frequency (RF) downlink communications signals;

convert the plurality of RF downlink communications signals into a plurality of optical downlink communications signals, respectively;

distribute the plurality of optical downlink communications signals to the at least one remote unit via the plurality of optical fiber-based communications media, respectively;

receive a plurality of optical uplink communications signals from the at least one remote unit via the plurality of optical fiber-based communications media, respectively; and convert the plurality of optical uplink communications signals into a plurality of RF uplink communications signals, respectively.

12. The WDS of claim 11, wherein the at least one remote unit is further configured to:

receive the plurality of optical downlink communications signals via the plurality of optical fiber-based communications media, respectively;

convert the plurality of optical downlink communications signals into the plurality of RF downlink communications signals, respectively;

receive the plurality of RF uplink communications signals;

convert the plurality of RF uplink communications signals into the plurality of optical uplink communications signals, respectively; and provide the plurality of optical uplink communications signals to the central unit via the plurality of optical fiber-based communications media, respectively.

13. A wireless distribution system (WDS), comprising:

a plurality of remote units comprising a transceiver comprising a phase locked loop (PLL) comprising:

a phase detector configured to:
receive a reference input signal and one of two feedback signals; and
output a control signal;

a first voltage controlled oscillator (VCO) configured to:
receive the control signal and output a first one of the two feedback signals; and
receive a first enable signal that activates the first VCO; and a second VCO configured to:
receive the control signal and output a second one of the two feedback signals; and
receive a second enable signal that activates the second VCO such that only one of the first VCO and the second VCO are active at a time; and a central unit, the central unit coupled to the plurality of remote units via a plurality of optical fiber-based communications media, respectively, and configured to:

distribute a plurality of downlink communications signals to the plurality of remote units via the plurality of optical fiber-based communications media, respectively; and receive a plurality of uplink communications signals from the plurality of remote units via the plurality of optical fiber-based communications media, respectively.

14. The WDS of claim 13, wherein each remote unit comprises at least one electrical-to-optical converter.

15. The WDS of claim 14, wherein the central unit is further configured to generate a plurality of communications signals based on the plurality of uplink communications signals, wherein each of the plurality of communications signals corresponds to a signal channel and a remote unit among the plurality of remote units communicating on the signal channel.

16. The WDS of claim 15, wherein the PLL further comprises a loop filter.

17. The WDS of claim 15, wherein the first VCO comprises a voltage controlled crystal oscillator.

18. The WDS of claim 15, wherein the central unit is further configured to:

receive a plurality of radio frequency (RF) downlink communications signals;

convert the plurality of RF downlink communications signals into a plurality of optical downlink communications signals, respectively; and distribute the plurality of optical downlink communications signals to the plurality of remote units via the plurality of optical fiber-based communications media, respectively.

* * * * *